(12) United States Patent
Andrews

(10) Patent No.: US 6,885,033 B2
(45) Date of Patent: Apr. 26, 2005

(54) LIGHT EMITTING DEVICES FOR LIGHT CONVERSION AND METHODS AND SEMICONDUCTOR CHIPS FOR FABRICATING THE SAME

(75) Inventor: Peter S. Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 9 days.

(21) Appl. No.: 10/385,034

(22) Filed: Mar. 10, 2003

(65) Prior Publication Data

US 2004/0178417 A1 Sep. 16, 2004

(51) Int. Cl.⁷ .............................................. H01L 33/00
(52) U.S. Cl. ............................. 257/79; 257/81; 257/91; 257/99
(58) Field of Search ............................. 257/81, 91, 99, 257/79

(56) References Cited

U.S. PATENT DOCUMENTS

| | | | |
|---|---|---|---|
| 4,918,497 A | 4/1990 | Edmond | 357/17 |
| 4,966,862 A | 10/1990 | Edmond | 437/100 |
| 5,027,168 A | 6/1991 | Edmond | 357/17 |
| 5,210,051 A | 5/1993 | Carter, Jr. | 437/107 |
| 5,338,944 A | 8/1994 | Edmond et al. | 257/76 |
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 437/22 |
| 5,631,190 A | 5/1997 | Negley | 438/33 |
| 5,739,554 A | 4/1998 | Edmond et al. | 257/103 |
| 5,912,477 A | 6/1999 | Negley | 257/95 |
| 6,120,600 A | 9/2000 | Edmond et al. | 117/89 |
| 6,187,606 B1 | 2/2001 | Edmond et al. | 438/46 |
| 6,201,262 B1 | 3/2001 | Edmond et al. | 257/77 |
| 6,245,259 B1 | 6/2001 | Höhn et al. | 252/301.36 |
| 6,635,503 B1 | 10/2003 | Andrews et al. | 438/27 |
| 2002/0123164 A1 | 9/2002 | Slater, Jr. et al. | 438/39 |
| 2003/0006418 A1 | 1/2003 | Emerson et al. | 257/79 |
| 2003/0030060 A1 * | 2/2003 | Okazaki | 257/79 |
| 2003/0038291 A1 * | 2/2003 | Cao | 257/99 |
| 2003/0038295 A1 * | 2/2003 | Koda | 257/98 |
| 2003/0080341 A1 * | 5/2003 | Sakano et al. | 257/79 |
| 2003/0089918 A1 | 5/2003 | Hiller et al. | 257/98 |
| 2003/0168663 A1 | 9/2003 | Slater, Jr. et al. | 257/77 |
| 2004/0051118 A1 | 3/2004 | Bruhns et al. | 257/200 |
| 2004/0056260 A1 | 3/2004 | Slater, Jr. et al. | 257/79 |

FOREIGN PATENT DOCUMENTS

| | | | | |
|---|---|---|---|---|
| GB | 2373368 A | * | 9/2002 | H01L/33/00 |
| JP | 2000-347601 A | * | 12/2000 | H01L/33/00 |
| JP | 2003-224307 | * | 8/2003 | H01L/33/00 |

OTHER PUBLICATIONS

U.S. Appl. No. 60/397,488, filed Jul. 19, 2002, Bruhns, Michael.
U.S. Appl. No. 60/415,898, filed Oct. 3, 2002, Bruhns, Michael.
U.S. Appl. No. 60/294,378, filed May 30, 2001, Emerson, David.

(Continued)

*Primary Examiner*—Jasmine Clark
(74) *Attorney, Agent, or Firm*—Myers Bigel Sibley & Sajovec

(57) ABSTRACT

Broad spectrum light emitting devices and methods and semiconductor chips for fabricating such devices include a light emitting element, such as a diode or laser, which emits light in a predefined range of frequencies. The light emitting element includes a shaped substrate suitable for light extraction through the substrate and a cavity in the substrate proximate the light emitting element. For example, a trench adjacent at least a portion of the periphery of the light emitting element may be provided. The cavity/trench is configured to contain light conversion material such that light extracted from sidewalls of the cavity/trench passes through the light conversion material contained in the cavity/trench. Methods of fabricating such devices and/or chips are also provided.

51 Claims, 6 Drawing Sheets

OTHER PUBLICATIONS

U.S. Appl. No. 60/294,445, filed May 30, 2001, Emerson, David.
U.S. Appl. No. 60/294,308, filed May 30, 2001, Emerson, David.
U.S. Appl. No. 10/140,796, filed May 7, 2002, Emerson, David.
U.S. Appl. No. 60/307,235, filed Jul. 23, 2001, Glass, Robert.
U.S. Appl. No. 10/057,821, filed Jan. 25, 2002, Glass, Robert.
U.S. Appl. No. 10/267,093, filed Oct. 4, 2002, Hiller, Norbert.
U.S. Appl. No. 60/335,649, filed Oct. 31, 2001, Hiller, Norbert.
U.S. Appl. No. 60/411,980, filed Sep. 19, 2002, Slater, David.
U.S. Appl. No. 10/368,063, filed Feb. 14, 2003, Slater, et al.

* cited by examiner

LIGHT EMITTING DEVICES FOR LIGHT CONVERSION AND METHODS AND SEMICONDUCTOR CHIPS FOR FABRICATING THE SAME

FIELD OF THE INVENTION

The present invention relates to semiconductor devices, and more particularly to semiconductor devices for producing light.

BACKGROUND OF THE INVENTION

Broad spectrum light emitting semiconductor devices have conventionally been fabricated by exciting a luminous substance with a relatively narrow spectrum light source. Conventionally, in such devices a light emitting diode (LED) or laser emits light in a narrow spectrum that is shifted and/or spread (i.e. converted) to provide a broader spectrum of light or a device with an output spectrum shifted from one range of the spectrum to another (e.g. blue to yellow, blue to green or to blue-green, or the like). Typically, it is desirable to provide white light from a narrow spectrum light source, such as an LED or laser. Such white light sources are described, for example, in U.S. Pat. No. 6,245,259, the disclosure of which is incorporated herein by reference as if set forth fully herein.

Conventional broad spectrum or converting light emitting devices are typically fabricated by mounting a narrow spectrum semiconductor light source on a submount and encapsulating the light source and the submount in a luminous material that provides the shift and/or spread to the light to a broader spectrum. The submount is typically configured to provide a "cup" that holds the luminous material and may provide a reflective surface. Contacts between the semiconductor light source are typically provided by the submount. Such techniques may limit the minimum size of a broad spectrum light emitting device and/or utilize several steps in manufacturing broad spectrum light emitting devices. Furthermore, such resulting devices may be less than optimal in certain applications, for example, in chip-on-board applications.

SUMMARY OF THE INVENTION

Embodiments of the present invention provide light emitting devices and methods and semiconductor chips for fabricating such devices. Such devices may include a light emitting element, such as a diode or laser, which emits light in a predefined range of frequencies. The light emitting element includes a shaped substrate suitable for light extraction through the substrate and a trench adjacent at least a portion of the periphery of the light emitting element. The trench is configured to contain light conversion material such that light extracted from sidewalls of the trench passes through the light conversion material contained in the trench.

In particular embodiments of the present invention, a light emitting device is provided having a substrate and a semiconductor light emitting element on the substrate. A trench is provided in the substrate adjacent at least a portion of the periphery of the light emitting element and has at least two sidewalls configured to contain a light conversion material. In certain embodiments of the present invention, the light emitting element is a gallium nitride based light emitting element. Furthermore, the substrate may be a silicon carbide substrate.

In further embodiments of the present invention, at least one of the two sidewalls is configured to provide light extraction from the substrate. Furthermore, the trench may have an opening on a surface of the substrate opposite the light emitting element or on the same side of the substrate as the light emitting element. The trench may also fully or partially surround the light emitting element.

In some embodiments of the present invention, the trench includes a floor and the two sidewalls are tapered sidewalls that extend from the floor of the trench to a surface of the substrate opposite the light emitting element. In other embodiments of the present invention, the trench has a floor and the two sidewalls include a tapered portion that extends from the floor of the trench and a non-tapered portion that extends from the tapered portion of the sidewalls to a surface of the substrate opposite the light emitting element.

In additional embodiments of the present invention, first and second contacts to the light emitting element are provided. The first contact and the second contact may each be on the same face of the substrate or the first contact and the second contact may be on opposite faces of the substrate. A reflector may also be provided between the first contact and the substrate and/or between the second contact and the substrate.

In some embodiments of the present invention, light conversion material is provided within the trench. The light conversion material may substantially fill the trench. Furthermore, a surface of the light conversion material proximate a surface of the substrate opposite the light emitting element may provide a convex or a concave surface with respect to the surface of the substrate. The light conversion material may also include a light diffusion material. The light conversion material may be a luminous material, for example, a phosphor such as YAG:Ce, a doped phosphor or may be a semiconductor nanocrystal material. In particular embodiments of the present invention, the light conversion material extends from the trench onto the substrate. For example, the light conversion material may cover a portion of the substrate circumscribed by the trench. The light conversion material may also provide a convex surface with respect to a surface of the portion of the substrate covered by the light conversion material.

In still further embodiments of the present invention, the trench is configured to provide an amount of luminous material at a location of the substrate that is proportional to an amount of light output by the location of the substrate. Furthermore, the composition of the luminous material may be uniform or non-uniform.

In other embodiments of the present invention, a method of fabricating a light emitting device having a substrate and a semiconductor light emitting element on the substrate includes forming a trench in the substrate about at least a portion of the periphery of the light emitting element and having at least two sidewalls configured to contain a light conversion material. The trench may be formed such that a least one of the at least two sidewalls is configured to provide light extraction from the substrate. The trench may also be formed to have an opening on a surface of the substrate opposite the light emitting element. The trench may be formed to have a floor and the at least two sidewalls are tapered sidewalls that extend from the floor of the trench to a surface of the substrate opposite the light emitting element. The trench may also be formed to have a floor and the at least two sidewalls each include a tapered portion that extends from the floor of the trench and a non-tapered portion that extends from the tapered portion of the sidewalls to a surface of the substrate opposite the light emitting element. Forming the trench may be provided by sawing into the substrate to form the trench, laser ablating, combinations of laser ablating and sawing or by other trench formation techniques.

Additional embodiments of the present invention also include forming first and second contacts to the light emitting element. The first and second contacts may be formed by forming the first contact on a first face of the substrate and forming the second contact on a second face of the substrate, opposite the first face of the substrate. The first and second contacts may also be formed by forming the first contact on a first face of the substrate and forming the second contact on the first face of the substrate.

Certain embodiments of the present invention also include depositing a light conversion material within the trench. The light conversion material may be deposited to substantially fill the trench. Embodiments of the present invention may also include depositing the light conversion material to extend from the trench onto the substrate. Depositing the light conversion material may be provided by depositing a light conversion material utilizing a spin-on process. Such an application may be provided at the wafer level, at the die level and/or both at the wafer level and at the die level. Depositing the light conversion material may be preceded by patterning a photoresist layer on the substrate between the trenches. Patterning the photoresist may be preceded by forming a contact on the substrate between the trenches and patterning the photoresist on the contact.

In further embodiments of the present invention, the light emitting device is provided as one of a plurality of light emitting devices on a wafer, and the fabrication of the light emitting device includes singulating the light emitting device from the wafer. Singulating the light emitting device may be accomplished by sawing through the substrate to singulate the light emitting device. The trench may also be provided by sawing trenches in the substrate prior to sawing through the substrate. The trenches may be sawn with each cut forming a single trench or multiple trenches. For example, a hub blade assembly could be used to make multiple trench cuts. Furthermore, as discussed above, trenches could be provided by laser cutting and the dies may be singulated by scribing and breaking the wafer along the scribe lines.

Additional embodiments of the present invention provide light emitting devices and method of fabricating light emitting devices having a substrate and a light emitting element on the substrate. At least one cavity is provided in the substrate proximate the light emitting element. The cavity is configured to contain a light conversion material. Light conversion material may be provided within the cavity.

In particular embodiments of the present invention, the substrate is a silicon carbide substrate. The light emitting element may also be a gallium nitride based light emitting element.

Furthermore, in certain embodiments of the present invention, the cavity may be a trench in the substrate. The cavity could also be a frusto-conical opening in the substrate. Other configurations of the cavity may also be utilized. Additionally, a plurality of cavities in the substrate could also be provided.

Additionally embodiments of the present invention provide for encapsulating the light emitting device in a protective structure, such as a dome. Additionally, contact leads may be provided to the contacts of the light emitting device Further embodiments of the present invention provide for mounting the light emitting device in a chip-on-board configuration.

In further embodiments of the present invention, a reflective coating or layer is provided on a sidewall of the trench and/or a sidewall of the light emitting device about the periphery of the device. Such a reflective layer may be provided to improve light conversion by, for example, reflecting light back into the light conversion material.

In still further embodiments of the present invention, the trench is shaped to improve light conversion by, for example, providing a substantially straight outer sidewall of the trench. Such a sidewall may improve reflection of light into the conversion material. Such a sidewall may also be provided with a reflective coating and/or layer on the sidewall.

DETAILED DESCRIPTION OF THE PREFERRED EMBODIMENTS

Figure 1:
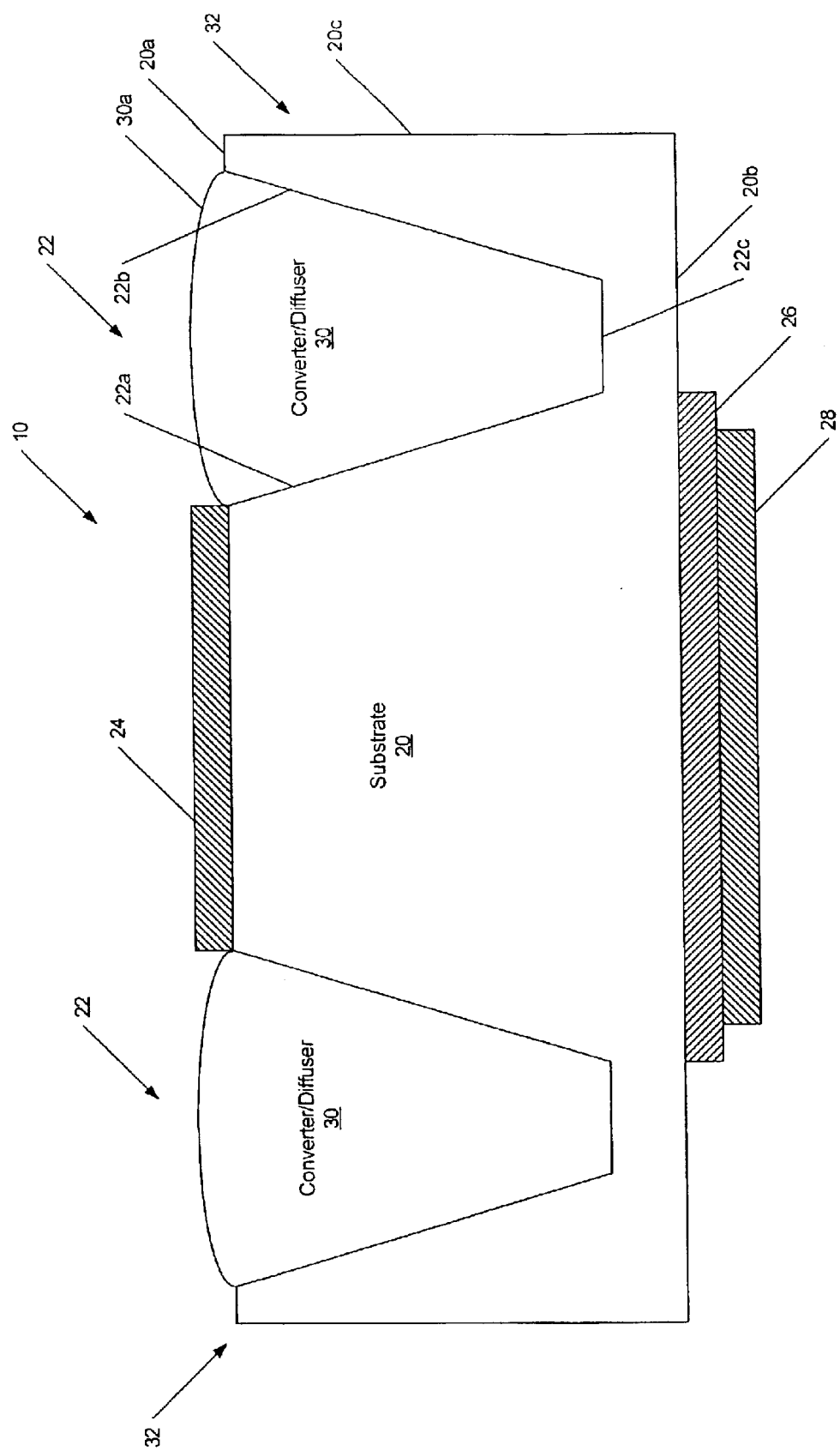
FIG. 1 is a cross-sectional view of a light emitting device according to some embodiments of the present invention.

The present invention now will be described more fully hereinafter with reference to the accompanying drawings, in which embodiments of the invention are shown. This invention, however, should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

FIG. 1 illustrates certain embodiments of the present invention that provide a light emitting device 10 that is suitable for use as a single chip broad spectrum light emitting device and/or narrow band light conversion light emitting device. The light emitting device 10 illustrated in FIG. 1 can provide broad spectrum light and/or converted narrow band light that may reduce the need to mount the device 10 on a submount or in a cup for holding light conversion material.

As seen in FIG. 1, a substrate 20, such as a silicon carbide substrate, has a first contact 24 provided on a first surface 20a of the substrate 20 and a light emitting element 26 provided on a second surface 20b of the substrate 20. A second contact 28 may also be provided on the light emitting element 26. The light emitting element 26 may be any suitable semiconductor light emitting element that provides a narrow spectrum light that is broadened to provide broad spectrum light and/or shifted to provide a converted spectrum light.

In particular embodiments of the present invention, the light emitting element 26 is a silicon carbide or gallium nitride based light emitting element. For example, the light emitting element 26 may be gallium nitride based LEDs or lasers fabricated on a silicon carbide substrate such as those devices manufactured and sold by Cree, Inc. of Durham, North Carolina For example, the present invention may be suitable for use with LEDs and/or lasers as described in U.S. Pat. Nos. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference as if set forth fully herein. Other suitable LEDs and/or lasers are described in U.S. Provisional Patent Application Serial No. 60/294,378, entitled "LIGHT EMITTING DIODE STRUCTURE WITH MULTI-QUANTUM WELL AND SUPERLATTICE STRUCTURE", U.S. Provisional Patent Application Serial No. 60/294,445, entitled "MULTI-QUANTUM LIGHT EMITTING DIODE STRUCTURE" and U.S. Provisional Patent Application Serial No. 60/294,308, entitled "LIGHT EMITTING DIDODE STRUCTURE WITH SUPERLATTICE STRUCTURE", each filed May 30, 2001, U.S. patent application Ser. No. 10/140,796, entitled "GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES", filed May 7, 2002, as well as U.S. Provisional Patent Application Serial No. 10/057,82, entitled "LIGHT EMITTING DIODES INCLUDING SUBSTRATE MODIFICATIONS FOR LIGHT EXTRACTION AND MANUFACTURING METHODS THEREFOR" filed Jul. 23, 2001 and U.S. patent application Ser. No. 10/057,82, filed Jan. 25, 2002 entitled "LIGHT EMITTING DIODES INCLUDING SUBSTRATE MODIFICATIONS FOR LIGHT EXTRACTION AND MANUFACTURING METHODS THEREFOR." the disclosures of which are incorporated herein as if set forth fully. Furthermore, phosphor coated LEDs, such as those described in U.S. Provisional Application Serial No. 60/411,980 entitled "PHOSPHOR-COATED LIGHT EMITTING DIODES INCLUDING TAPERED SIDEWALLS, AND FABRICATION METHODS THEREFOR," filed Sep. 19, 2002, the disclosure of which is incorporated by reference herein as if set forth full, may also be suitable for use in embodiments of the present invention.

The LEDs and/or lasers may be configured to operate in a "flip-chip" configuration such that light emission occurs through the substrate. In such embodiments, the substrate may be patterned so as to enhance light output of the devices as is described, for example, in U.S. Provisional Patent Application Ser. No. 60/307,235 filed Jul. 23, 2001 entitled "LIGHT EMITTING DIODES INCLUDING SUBSTRATE MODIFICATIONS FOR LIGHT EXTRACTION AND MANUFACTURING METHODS THEREFOR" or as described in U.S. patent application Ser. No. 10/057,821, filed Jan. 25, 2002, entitled "LIGHT EMITTING DIODES INCLUDING SUBSTRATE MODIFICATIONS FOR LIGHT EXTRACTION AND MANUFACTURING METHODS THEREFOR," the disclosures of which are incorporated herein by reference as if set forth fully herein.

The first and second contacts 24 and 28 may be a suitable contact material based on the substrate material and the light emitting element material(s). Such contact materials are known to those of skill in the art and will not be described further herein. Furthermore, the first contact 24 and/or the second contact 28 may include a reflective layer (not separately shown) such as described in U.S. patent application Ser. No. 10/368,063, entitled "REFLECTIVE OHMIC CONTACTS FOR SILICON CARBIDE INCLUDING A LAYER CONSISTING OF NICKEL, METHODS OF FABRICATING SAME, AND LIGHT EMITTING DIODES INCLUDING THE SAME", filed Feb. 14, 2003, the disclosure of which is incorporated herein by reference as if set forth fully herein.

As is further illustrated in FIG. 1, a trench 22 is provided in the substrate 20 adjacent at least a portion of the periphery of the light emitting element 26. In particular embodiments, the trench 22 circumscribes the light emitting element 26. The trench 22 opens on the first surface 20a of the substrate 20 opposite the light emitting element 26. In other embodiments, the trench may open on the second surface 20b of the substrate 20 that is on the same side of the substrate 20 as the light emitting element 26. The trench 22 may be non-overlapping, partially overlapping or completely overlapping with the light emitting element 26. In plan view, the trench 22 may be a complete or partial rectangle, square, circle, polygon ellipse and/or other such geometric configuration at least partially surrounding the light emitting element 26. In particular, the trench 22 may have a geometric shape that corresponds to the geometric shape of the light emitting element 26. In certain embodiments of the present invention, the trench 22 is shaped so as to provide for light extraction from the substrate 20. For example, the sidewalls of the trench 22 may be shaped to provide the substrate configurations described in the commonly assigned United States Patent Applications discussed herein.

In the embodiments illustrated in FIG. 1, the trench 22 has two tapered sidewalls 22a and 22b and a floor 22c. The tapered sidewalls 22a and 22b extend from the floor 22c to the first surface 20a of the substrate 20. Thus, the sidewall 22a provides a continuously tapered sidewall of the substrate 20 through which light from the light emitting element 26 is extracted. Furthermore, the sidewall 22b may be continuously tapered such that light from the sidewall 22a that is incident on the sidewall 22b is reflected back into the trench 22 and/or out the opening of the trench 22. Thus, in addition to providing light extraction, the sidewalls of the trench 22 may be configured to provide light containment and/or diffusion.

The light emitting device 10 illustrated in FIG. 1 is defined by outer sidewalls 32 that extend through the substrate 20 so as to provide individual devices. Such devices may include one or more light emitting elements 26 as described, for example, commonly assigned in U.S. patent application Ser. No. 10/058,369, entitled "CLUSTER PACKAGING OF LIGHT EMITTING DIODES", filed Jan. 28, 2002, the disclosure of which is incorporated herein by reference as if set forth fully herein. Singulation of individual devices from a wafer having a plurality of devices may, for example, be provided by sawing through the substrate 20 outside the trench 22. Singulation could also be provided utilizing a combination of sawing, trench formation and breaking as described in commonly assigned U.S. patent application Ser. No. 60/415,898, entitled "TRENCH CUT LIGHT EMITTING DIODES AND METHODS OF FABRICATING SAME" filed Oct. 3, 2002 and U.S. patent application Ser. No. 60/397,488, entitled "TRENCH CUT LIGHT EMITTING DIODES AND METHODS OF FAB- RICATING SAME", filed Jul. 19, 2002, the disclosures of which are incorporated herein by reference as if set forth fully herein. While embodiments of the present invention are described with reference to particular techniques for singulation, any technique for singulation may be utilized that results in the opposing sidewalls of the trench 22 remaining substantially intact.

As is further seen in FIG. 1, in certain embodiments of the present invention, the trench 22 contains at least one light conversion material 30 that may also include a light diffusion material. The light conversion material 30 may completely fill or partially fill the trench 22. The light conversion material 30 may be of uniform or non-uniform composition. For example, the composition of the light conversion material 30 may be varied with depth into the trench. Furthermore, the exposed surface 30a of the light conversion material 30 may be convex, concave and/or substantially parallel with respect to the first surface 20a of the substrate 20. In certain embodiments of the present invention, the particular shape of the surface 30a of the light conversion material 30 may be selected so as to provide dispersion or concentration of light emitted from the light conversion material 30.

The light conversion material 30 may, for example, be a luminous material. The luminous material may, for example, include phosphors such as YAG:Ce or the like and, in some embodiments, may include other materials for diffusion of light. For example, may be commercially available Ce:YAG, Ce:YAG with Gd doping, Ce:YAG with Ga and Gd doping and/or Ce:YAG with Gd or similar dopant. Furthermore, CdSe Nanocrystals or similar material that are spherical II–VI, III–V, or IV–VI semiconductor crystals that are small enough such that quantum confinement effects predominate. In this size range, the physical size of the nanocrystals affects the optical and electronic properties they exhibit. For instance, the onset of absorption and the fluorescence wavelength may, thereby, be controlled. Currently available nanocrystals include CdSe nanocrystals with or without a ZnS shell that have a tunable emission from 470–670 nm, and PbSe nanocrystals that have a tunable emission from 1000–2000 nm. As will be appreciated by those of skill in the art in light of the present disclosure, the light conversion material may also be incorporated with other materials, for example, to provide a protective coating, to provide a coating that secures the light conversion material to the substrate, to provide a light conversion material with desired thermal properties or to provide a coating with suitable application properties, such as viscosity or drying time.

The light conversion material 30, which may be a luminous material, may be provided by, for example, a spin-on process or other blanket coating techniques, an inkjet application system, an air brush application system, a fluid application system, a dust application system utilizing charged particles which are attracted to light emitting elements having an opposite charge (electrostatic deposition), electrophoretic deposition, screen printing, dipping, roll coating and/or vacuum deposition and/or other suitable techniques known to those of skill in the art. The application of luminous material may be provided before or after singulation of the devices. Furthermore, application of the luminous material may occur before or after a device or devices are mounted to a submount if such mounting is utilized. Application of the light conversion material 30 may be provided in a single application or in multiple applications, for example, in a layering process where different composition light conversion materials are provided at different depths in the trench 22. Techniques for the application of luminous material are described in U.S. Provisional Patent Application Serial No. 60/335,649, filed Oct. 31, 2001, entitled "BROAD SPECTRUM LIGHT EMITTING DEVICES AND METHODS AND SYSTEMS FOR FABRICATING THE SAME," and in U.S. patent application Ser. No. 10/267,093 filed Oct. 4, 2002 entitled "BROAD SPECTRUM LIGHT EMITTING DEVICES AND METHODS AND SYSTEMS FOR FABRICATING THE SAME," the disclosures of which are incorporated herein by reference as if set forth fully herein.

Additionally, a reflective layer or coating (not shown), such as a layer of nickel or other reflective material, may be provided on the outer sidewall 22b of the trench 22. Similarly, a reflective layer or coating (not shown) could be provided on the sidewall 20c of the substrate 20. Such reflective layers or coatings may provide improved light conversion by reflecting light back into the light conversion material 30.

Figure 2:
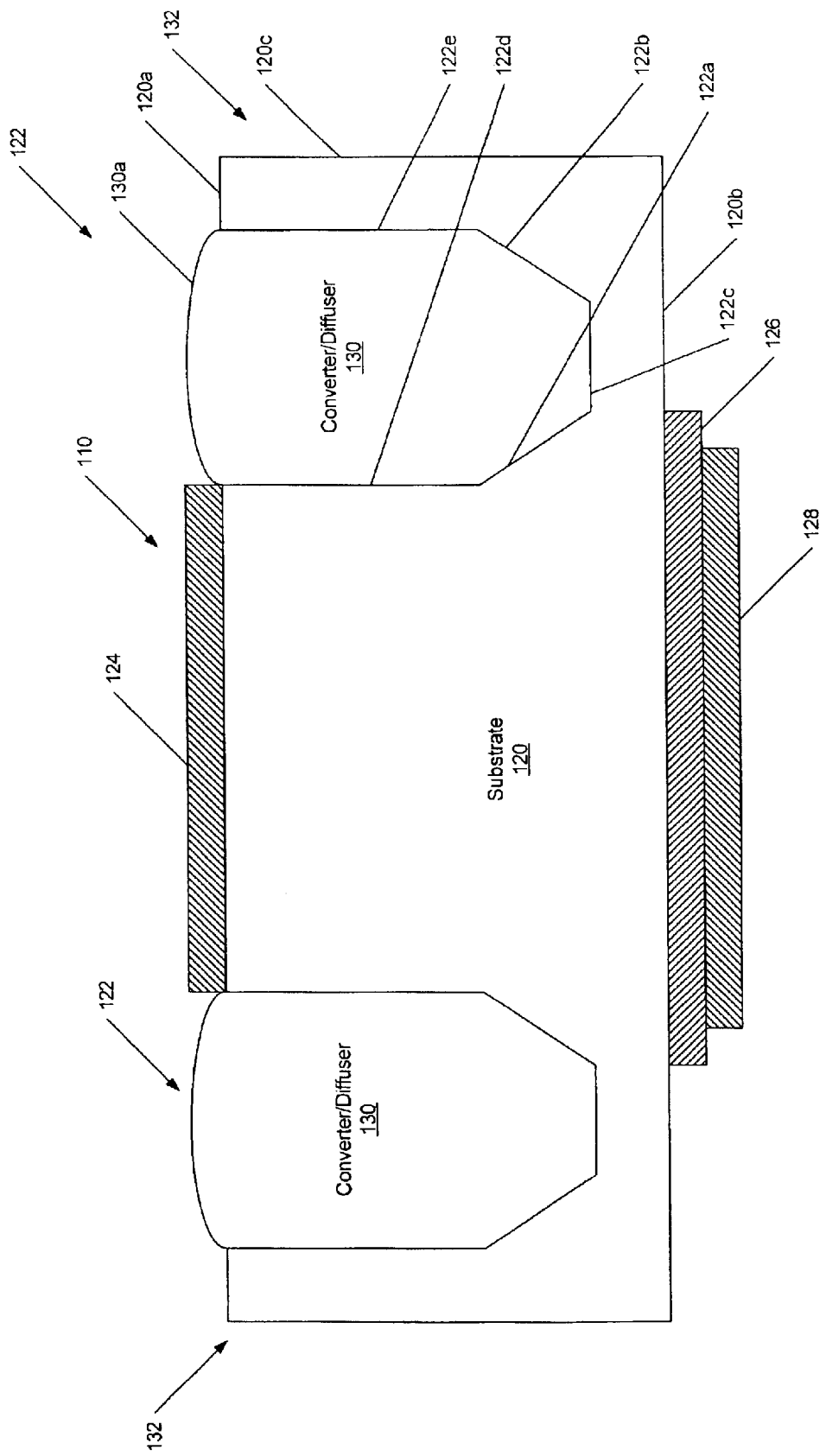
FIG. 2 is a cross-sectional view of a light emitting device according to further embodiments of the present invention.

FIG. 2 illustrates further embodiments of the present invention that provide a light emitting device 110 that is suitable for use as a single chip broad spectrum light emitting device. As seen in FIG. 2, a substrate 120, such as a silicon carbide substrate, has a first contact 124 provided on a first surface 120a of the substrate 120 and a light emitting element 126 provided on a second surface 120b of the substrate 120. A second contact 128 may also be provided on the light emitting element 126. The light emitting element 126 may be any suitable semiconductor light emitting element as described above with reference to the light emitting element 26 of FIG. 1. The first and second contacts 124 and 128 may be a suitable contact material based on the substrate material and the light emitting element material(s) as described above with reference to the contacts 24 and 28 of FIG. 1.

As is further illustrated in FIG. 2, a trench 122 is provided in the substrate 120 about at least a portion of the periphery of the light emitting element 126. In particular embodiments, the trench 122 circumscribes the light emitting element 126. The trench 122 opens on the first surface 120a of the substrate 120 opposite the light emitting element 126. The trench 122 may be non-overlapping, partially overlapping or completely overlapping with the light emitting element 126 and may have a plan view configuration as described above with reference to the trench 22. In certain embodiments of the present invention, the trench 122 is shaped so as to provide for light extraction from the substrate 120. In the embodiments illustrated in FIG. 2, the trench 122 has two tapered sidewalls 122a and 122b, two non-tapered sidewalls 122d and 122e and a floor 122c. The tapered sidewalls 122a and 122b extend from the floor 122c to respective ones of the non-tapered sidewalls 122d and 122e. The non-tapered sidewalls 122d and 122e extend from the tapered sidewalls 122a and 122b to the first surface 120a of the substrate 120. Thus, the sidewall 22a provides a continuously tapered sidewall portion and a portion substantially perpendicular to the surface 120a of the substrate 120 through which light from the light emitting element 126 is extracted. Furthermore, the sidewalls 122b and 122e may be shaped such that light from the sidewalls 122a and 122d that is incident on the sidewalls 122b and 122e is reflected back into the trench 122. Thus, in addition to providing light extraction, the sidewalls of the trench 122 may be configured to provide light containment.

The light emitting device 110 illustrated in FIG. 2 is defined by outer sidewalls 132 that extend through the substrate 120 so as to provide individual devices. Such devices may include one or more light emitting elements 26 as described above with reference to FIG. 1. Furthermore, singulation may also be carried out as described about with reference to FIG. 1.

As is further seen in FIG. 2, in certain embodiments of the present invention, the trench 122 contains a light conversion material 130 that may also include a light diffusion material as described above with reference to FIG. 1. The light conversion material 130 may completely fill or partially fill the trench 122. Furthermore, the exposed surface 130a of the light conversion material 130 may be convex, concave or substantially parallel with respect to the first surface 120a of the substrate 120. In certain embodiments of the present invention, the particular shape of the surface 130a of the light conversion material 130 may be selected so as to provide dispersion or concentration of light emitted from the light conversion material 130.

Additionally, a reflective layer or coating (not shown), such as a layer of nickel or other reflective material, may be provided on the outer sidewall 122b of the trench 122. Similarly, a reflective layer or coating (not shown) could be provided on the sidewall 120c of the substrate 120. Such reflective layers or coatings may provide improved light conversion by reflecting light back into the light conversion material 130.

Figure 3:
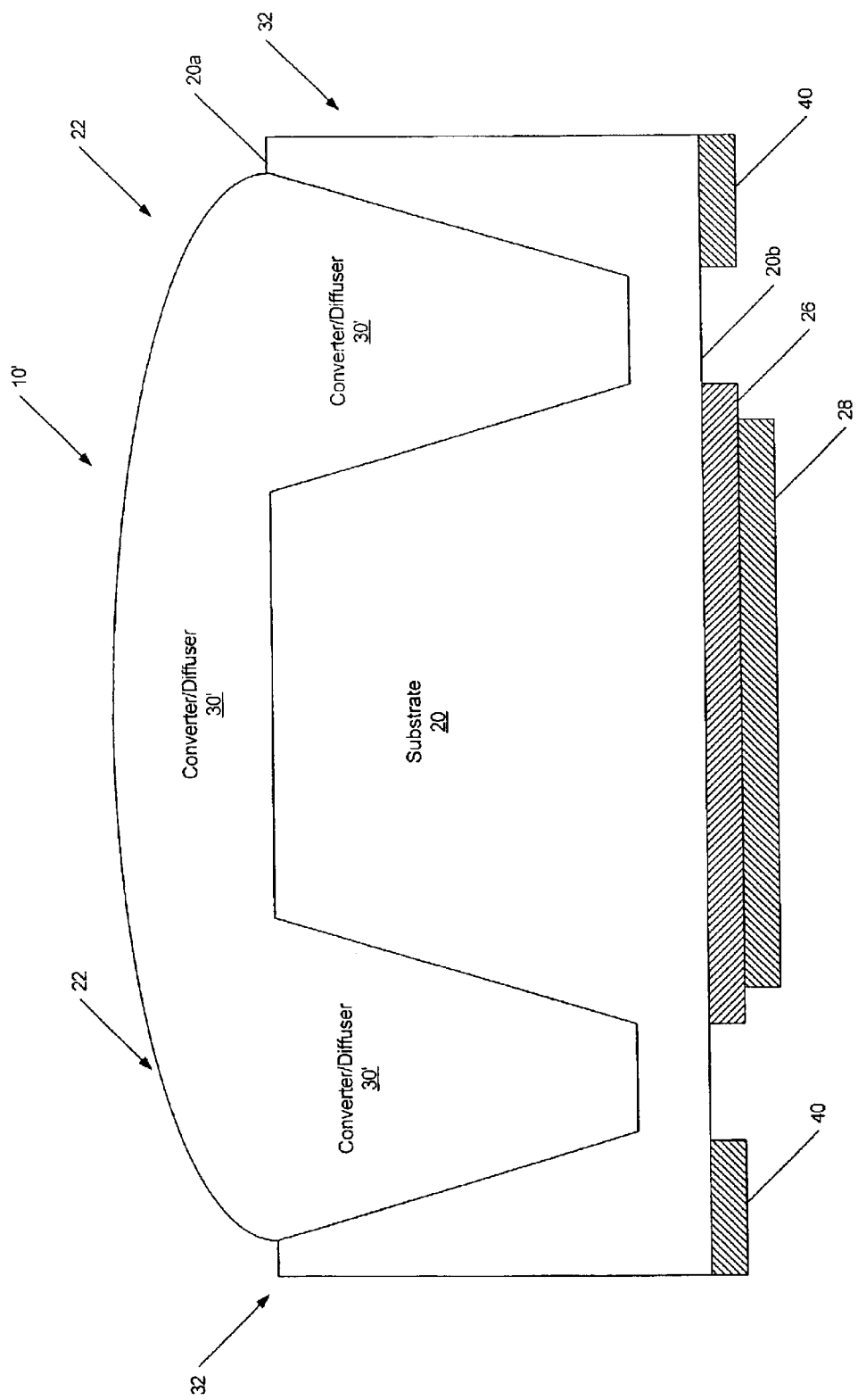
FIG. 3 is a cross-sectional view of a light emitting device according to further embodiments of the present invention.

FIG. 3 illustrates further embodiments of a light emitting device 10' according to the present invention where both contacts of the device 10' are on the same side of the substrate 20. As is seen in FIG. 3, a first contact 40 is provided on the surface 20b of the substrate 20. Thus, the first contact 40 and the second contact 28 are both on the same side of the substrate 20. Such a configuration may facilitate "flip-chip" mounting of the device 10'. As is further illustrated in FIG. 3, the light conversion material 30' is provided within the trench 22 and on at least a portion of the surface 20a of the substrate 20. The light conversion material 30' may also include a diffuser as discussed above with respect to the light conversion material 30. Furthermore, the light conversion material 30' may be provided so that the exposed surface of the light conversion material forms a convex surface as illustrated in FIG. 3. Alternatively, the light conversion material 30' may be provided as illustrated in FIG. 1 to completely cover the portion of the surface 20a defined by the trench 22 or as covering less than all of the portion the surface 20a. Furthermore, the reflective layers/coatings may also be provided on the sidewalls of the substrate and/or trench as described above with reference to FIGS. 1 and 2.

The trenches 22 and 122 illustrated in FIGS. 1, 2 and 3 may extend into the substrate 20 or 120 a predefined distance. For example, the trenches 22 and 122 may have a depth of about 120 μm for a 135 μm thick device or about 235 μm for a 250 μm thick device. Such thickness will, however, be dependent on the substrate thickness. Furthermore, in certain embodiments, the depth of the trenches 22 and 122 may be such that at least about 15–25 μm of the substrate 20 or 120 remains. In particular embodiments of the present invention, the width of the trenches 22 and 122 may be about twice the depth of the trench multiplied by the tangent of 30° at their widest point and from about 20 μm to about 0 μm at their narrowest point. Each of these dimensions may vary depending on the amount of light conversion material 30 and 130 desired for a particular device.

Furthermore, the shape of the trench 22, 122 may be selected so as to provide differing concentrations of the light conversion material based on the output of the light source so as to provide uniformity of conversion. Thus, for example, with sloped sidewalls of the trenches 22 and 122 more light conversion material may be provided closer to the light extraction surface 20a and 120a of the substrate 20 and 120a so that additional light conversion material is provided where the light output of the device is increased. For example, in certain embodiments of the present invention, the slope or angle of the tapered sidewalls 22a, 22b, 122a and 122b with respect to the first surface 20a and 1 20a may be from about 60 to about 0 degrees. Furthermore, the length of the tapered portions 122a and/or 122b may be from about 0 to about 100 percent of the total depth of the trench 122.

While the trenches described herein have been described with tapering sidewalls, straight sidewalls and/or a flat floor, other shapes may also be utilized. For example, a curved floor, either convex or concave, and/or no floor could also be provided. Also, a retrograde shape or curved shape may be provided for one or more of the sidewalls. Thus, embodiments of the present invention should not be construed as limited to a particular shape trench but may include any shape of trench that may provide a moat for containing the light conversion material.

While embodiments of the present invention have been described above with reference to a trench, other configurations of cavities within the substrate suitable for containing light conversion material may also be utilized. For example, holes or pits, such as frusto-conical opening having slope sidewalls, a hole having straight sidewalls, holes having combinations of straight and slope sidewalls or the like, within the substrate 20 may be provided in a region proximate the light emitting element 26 and light conversion material provided within the holes or pits. An array of such openings with the array having uniformly spaced, non-uniformly spaced, regularly spaced and/or irregularly spaced openings, or a single opening could be provided in the region of the light emitting element. Accordingly, embodiments of the present invention should not be construed as limited to a single trench or multiple trenches but may include any cavity configuration in the substrate 20 having opposing sidewalls capable of containing light conversion material.

Figure 4:
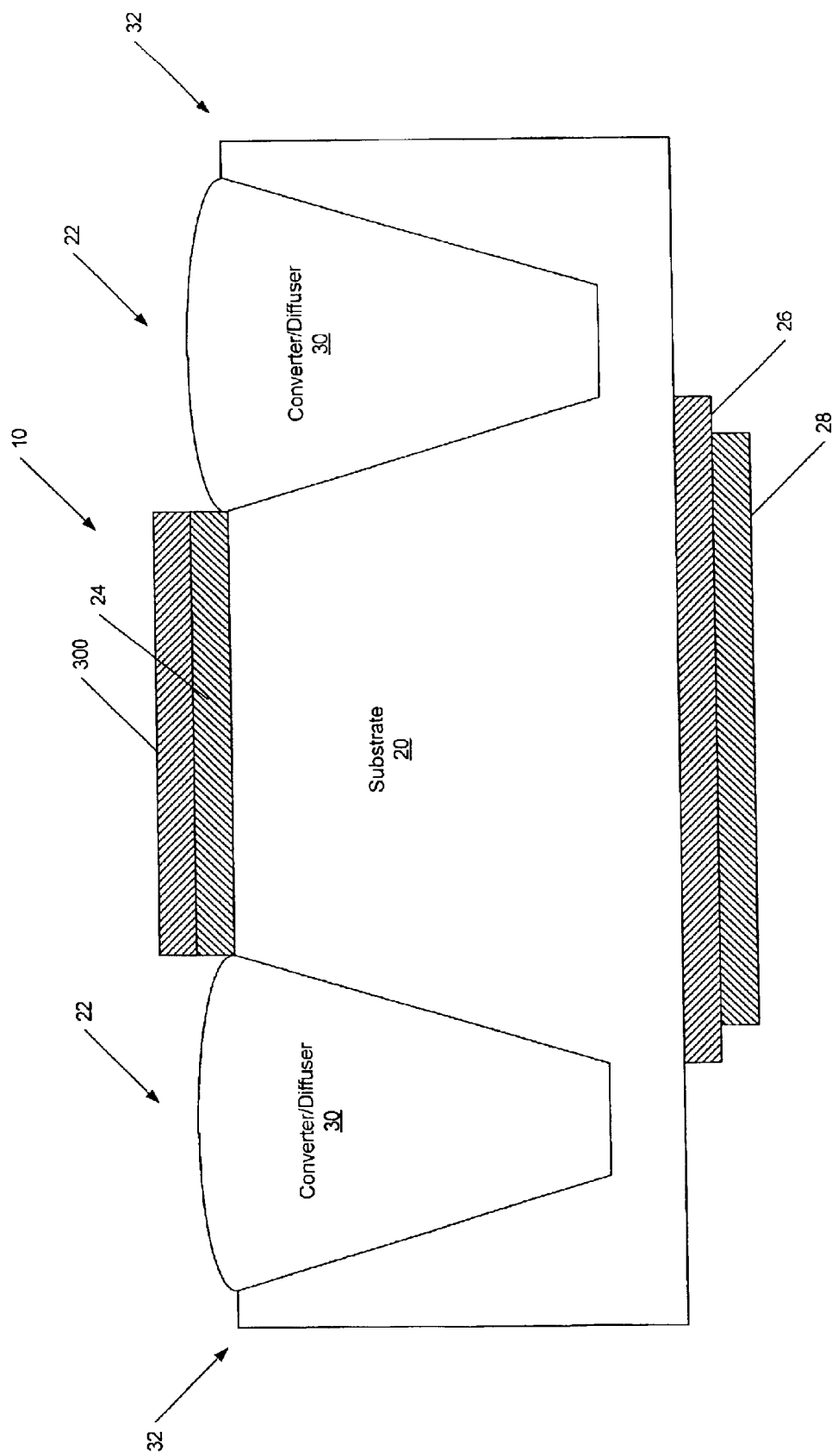
FIG. 4 is a cross-sectional view illustrating fabrication of a light emitting device according to certain embodiments of the present invention.

Embodiments of the present invention may be fabricated generally as described above. In particular embodiments of the present invention, a lift-off technique may be utilized as illustrated in FIG. 4. As seen in FIG. 4, a photoresist layer 300 may be provided on at least a portion of the region of substrate 20 between the trenches 22. The photoresist 300 may be provided on the contact 24 and/or a bond pad provided on the contact 24 and/or mirror structure if provided. The light conversion material 30 may then be deposited, for example, by a spin-on process as described above. The photoresist 300 may be removed before or after singulation of the device 10. The photoresist 300, therefore, may be utilized to give temporary height to the structure during application of the light conversion material 30 and may also serve to maintain the integrity of the contact 24 and/or bond pad. Alternatively, the photoresist 300 could be provided directly on the substrate 20 prior to formation of the contact 24 and removed for formation of the contact 24.

Figure 5:
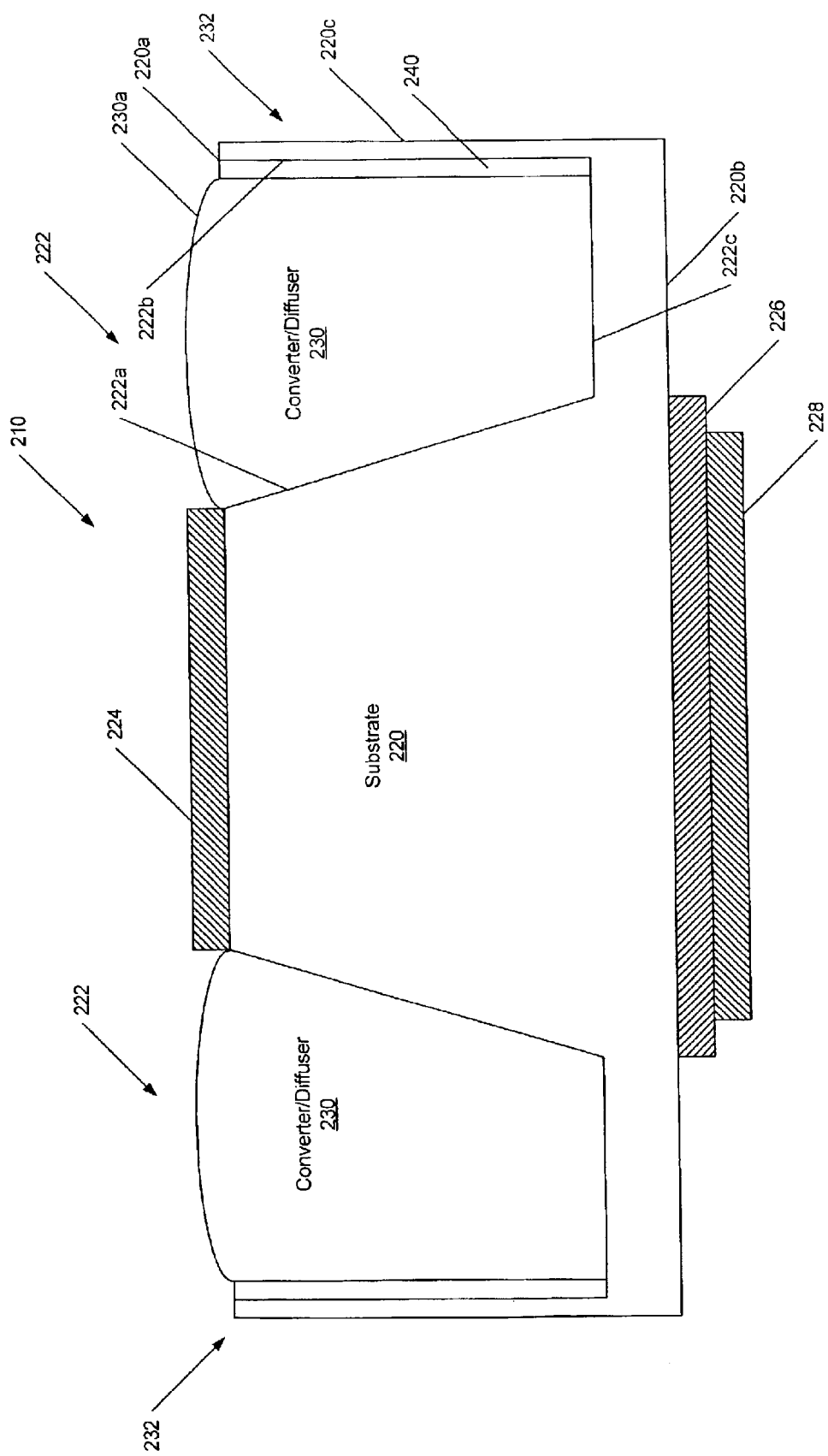
FIG. 5 is a cross-sectional view illustrating fabrication of a light emitting device according to certain embodiments of the present invention.

FIG. 5 illustrates further embodiments of the present invention that provide a light emitting device 210 that is suitable for use as a single chip broad spectrum light emitting device. As seen in FIG. 5, a substrate 220, such as a silicon carbide substrate, has a first contact 224 provided on a first surface 220a of the substrate 220 and a light emitting element 226 provided on a second surface 220b of the substrate 220. A second contact 228 may also be provided on the light emitting element 226. The light emitting element 226 may be any suitable semiconductor light emitting element as described above with reference to the light emitting element 26 of FIG. 1. The first and second contacts 224 and 228 may be a suitable contact material based on the substrate material and the light emitting element material(s) as described above with reference to the contacts 24 and 28 of FIG. 1.

As is further illustrated in FIG. 5, a trench 222 is provided in the substrate 220 about at least a portion of the periphery of the light emitting element 226. In particular embodiments, the trench 222 circumscribes the light emitting element 226. The trench 222 opens on the first surface 220a of the substrate 220 opposite the light emitting element 226. The trench 222 may be non-overlapping, partially overlapping or completely overlapping with the light emitting element 226 and may have a plan view configuration as described above with reference to the trench 22. In certain embodiments of the present invention, the trench 222 is shaped so as to provide for light extraction from the substrate 220. In the embodiments illustrated in FIG. 5, the trench 222 has one tapered sidewall 222a, one straight, non-tapered sidewall 222b and a floor 122c. The tapered sidewall 222a and the non-tapered sidewall 222b extend from the floor 222c to the first surface 220a. Thus, the sidewall 222b may be shaped such that light from the sidewall 222a that is incident on the sidewall 222b is reflected back into the trench 222. Such reflection of light may be further by an optional reflective layer or coating 240 that is provided on the sidewall 222b so as to reflect light back into the trench 222. Thus, in addition to providing light extraction, the sidewalls of the trench 222 may be configured to provide light containment.

The light emitting device 210 illustrated in FIG. 5 is defined by outer sidewalls 232 that extend through the substrate 220 so as to provide individual devices. Such devices may include one or more light emitting elements 26 as described above with reference to FIG. 1. Furthermore, singulation may also be carried out as described about with reference to FIG. 1.

As is further seen in FIG. 5, in certain embodiments of the present invention, the trench 222 contains a light conversion material 230 that may also include a light diffusion material as described above with reference to FIG. 1. The light conversion material 230 may completely fill or partially fill the trench 222. Furthermore, the exposed surface 230a of the light conversion material 230 may be convex, concave or substantially parallel with respect to the first surface 220a of the substrate 220. In certain embodiments of the present invention, the particular shape of the surface 230a of the light conversion material 230 may be selected so as to provide dispersion or concentration of light emitted from the light conversion material 230.

As briefly described above, a reflective layer or coating 240, such as a layer of nickel or other reflective material, may be provided on the outer sidewall 222b of the trench 222. In addition or alternatively, the reflective layer or coating 240 could be provided on the sidewall 220c of the substrate 220. Such reflective layers or coatings may provide improved light conversion by reflecting light back into the light conversion material 230.

Figure 6:
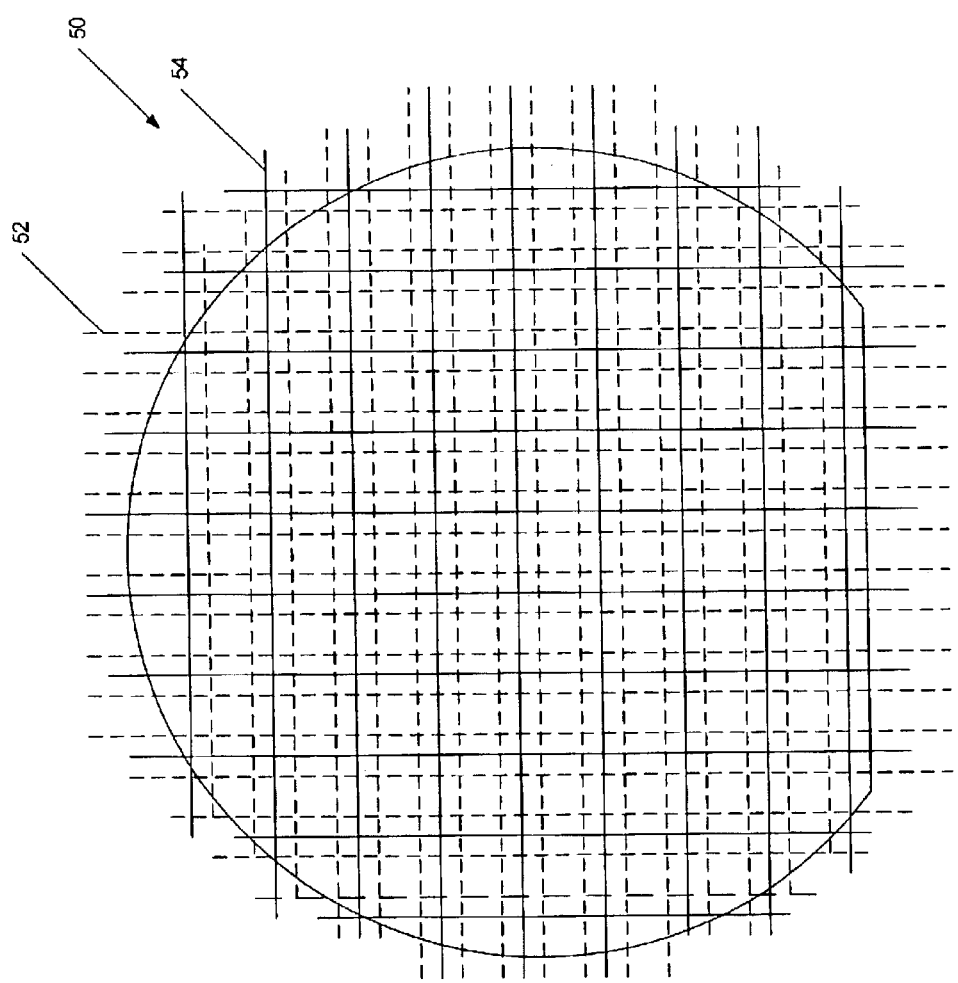
FIG. 6 is a plan view of a wafer illustrating operations for fabrication of a light emitting device according to certain embodiments of the present invention.

FIG. 6 illustrates operations for formation of the trenches 22 and 122 and singulation of individual devices utilizing a sawing and/or sawing and breaking technique. As seen in FIG. 6, a wafer 50 may be sawn to a partial depth where the profile of the saw blade provides the profile of the trench. Thus, for example, the width of the trench may correspond to the kerf of the saw blade and the depth of the trench may correspond to the cut depth of the saw blade. The partial depth saw cuts 52 that form the trench 22, 122 of FIGS. 1–3 are illustrated with broken lines in FIG. 6. Subsequent complete saw cuts 54 may then be provided to saw completely through the wafer 50 and singulate individual chips. Alternatively, differing depth saw cuts may be made and the wafer 50 broken along the deeper saw cuts to provide singulation. A hub blade assembly that provides multiple cuts in a single pass may be particularly well suited for providing the multiple trenches/cuts illustrated in FIG. 6. Other techniques for forming the trenches and/or singulation as described above may also be utilized.

While certain embodiments of the present invention may provide broad spectrum and/or converted light emitting devices without utilizing a submount or domed structure, light emitting devices according to the present invention may be utilized with such structures. For example, light emitting devices according to certain embodiments of the present invention may be encapsulated in a protective structure such as is conventionally done with existing light emitting devices and is described in the patents and/or patent application discussed herein. Furthermore, contact leads may be provided to the contacts/bond pads of the light emitting devices so as to facilitate use of the devices in an electrical circuit. Additionally, light emitting devices may be mounted directly on a circuit board or substrate in a "chip-on-board" configuration with or without further encapsulation of the device.

In the drawings and specification, there have been disclosed typical preferred embodiments of the invention and, although specific terms are employed, they are used in a generic and descriptive sense only and not for purposes of limitation.

That which is claimed is:

1. A light emitting device, comprising:
   a substrate;
   a semiconductor light emitting element on a surface of the substrate; and
   a trench in the substrate adjacent at least a portion of the periphery of the light emitting elements, the trench having at least two sidewalls configured to contain a light conversion material and extending into the substrate to a depth different than a depth of the surface of the substrate on which the semiconductor light emitting element is provided.

2. The light emitting device of claim 1, wherein at least one of the at least two sidewalls is configured to provide light extraction from the substrate.

3. The light emitting device of claim 2, wherein at least one of the at least two sidewalls is configured to reflect light into the trench.

4. The light emitting device of claim 1, wherein the trench has an opening on a surface of the substrate opposite the light emitting element.

5. The light emitting device of claim 1, wherein the trench has an opening on a same surface of the substrate as the light emitting element.

6. The light emitting device of claim 1, wherein the trench completely surrounds the light emitting element.

7. The light emitting device of claim 1, wherein the trench partially surrounds the light emitting element.

8. The light emitting device of claim 1, further comprising a light conversion material within the trench.

9. The light emitting device of claim 8, wherein the light conversion material broadens a spectrum of light output by the light emitting element and wherein the light emitting device is a broad spectrum light emitting device.

10. The light emitting device of claim 8, wherein the light conversion material shifts a spectrum of light output by the light emitting element without substantially broadening the spectrum of light.

11. The light emitting device of claim 9, wherein an exposed surface of the light conversion material provides a convex surface with respect to the surface of the substrate.

12. The light emitting device of claim 9, wherein an exposed surface of the light conversion material provides a concave surface with respect to the surface of the substrate.

13. The light emitting device of claim 8, wherein the light conversion material extends from the trench onto the substrate.

14. The light emitting device of claim 13, wherein the light conversion material covers a portion of the substrate circumscribed by the trench.

15. The light emitting device of claim 14, wherein the light conversion material provides a convex surface with respect to a surface of the portion of the substrate covered by the light conversion material.

16. The light emitting device of claim 1, wherein the light emitting element comprises a gallium nitride based light emitting element.

17. The light emitting device of claim 1, further comprising a light conversion material in the trench and wherein the light conversion material comprises a luminous material.

18. The light emitting device of claim 17, wherein the luminous material comprises YAG:Ce, doped YAG:Ce and/or a semiconductor nanocrystal.

19. The light emitting device of claim 17, wherein the trench is configured to provide an amount of luminous material at a location of the substrate that is proportional to an amount of light output by the location of the substrate.

20. The light emitting device of claim 17, wherein the composition of the luminous material is substantially uniform within the trench.

21. The light emitting device of claim 17, wherein the composition of the luminous material is non-uniform within the trench.

22. The light emitting device of claim 1 further comprising a reflective material on an outer one of the at least one sidewalls of the trench.

23. The light emitting device of claim 1, wherein a substrate sidewall extends through the substrate adjacent and spaced apart from the trench and opposite the trench from the semiconductor light emitting element so as to define a periphery of the light emitting device.

24. The light emitting device of claim 23, further comprising a reflective material on the substrate sidewall.

25. A light emitting device, comprising:
a substrate;
a semiconductor light emitting element on the substrate;
a trench in the substrate adjacent at least a portion of the periphery of the light emitting element and having at least two sidewalls configured to contain a light conversion material; and
wherein the trench further comprises a floor and wherein the at least two sidewalls comprise tapered sidewalls that extend from the floor of the trench to a surface of the substrate opposite the light emitting element.

26. A light emitting device, comprising:
a substrate;
a semiconductor light emitting element on the substrate;
a trench in the substrate adjacent at least a portion of the periphery of the light emitting element and having at least two sidewalls configured to contain a light conversion material; and
wherein the trench further comprises a floor and wherein the at least two sidewalls comprise a tapered portion that extends from the floor of the trench and a non-tapered portion that extends from the tapered portion of the sidewalls to a surface of the substrate opposite the light emitting element.

27. A light emitting device, comprising:
a substrate;
a semiconductor light emitting element on the substrate;
a trench in the substrate adjacent at least a portion of the periphery of the light emitting element and having at least two sidewalls configured to contain a light conversion material; and
wherein the at least two sidewall comprise a tapered sidewall and a non-tapered sidewall.

28. A light emitting device, comprising:
a substrate;
a semiconductor light emitting element on the substrate;
a trench in the substrate adjacent at least a portion of the periphery of the light emitting element and having at least two sidewalls configured to contain a light conversion material; and
first and second contacts to the light emitting element.

29. The light emitting device of claim 28, wherein the first contact and the second contact are each on a same surface of the substrate.

30. The light emitting device of claim 28, wherein the first contact and the second contact are each on opposite surfaces of the substrate.

31. The light emitting device of claim 28, further comprising a reflector associated with at least one of the first contact and the second contact to the light emitting element.

32. A light emitting device, comprising:
a substrate;
a semiconductor light emitting element on the substrate;
a trench in the substrate adjacent at least a portion of the periphery of the light emitting element and having at least two sidewalls configured to contain a light conversion material; and
a light conversion material within the trench, wherein the light conversion material substantially fills the trench.

33. A light emitting device, comprising:
a substrate;
a semiconductor light emitting element on the substrate;
a trench in the substrate adjacent at least a portion of the periphery of the light emitting element and having at least two sidewalls configured to contain a light conversion material; and
a light conversion material within the trench, wherein the light conversion material includes a light diffusion material.

34. A light emitting device, comprising:
a substrate;
a semiconductor light emitting element on the substrate; and
a trench in the substrate adjacent at least a portion of the periphery of the light emitting element and having at least two sidewalls configured to contain a light conversion material; and
wherein the substrate comprises a silicon carbide substrate.

35. A light emitting device, comprising:

a substrate;

a light emitting element on the substrate; and at least one cavity in the substrate proximate the light emitting element, the cavity being configured to contain a light conversion material and extending into the substrate to a depth different than a depth of a surface of the substrate on which the semiconductor light emitting element is provided.

36. The light emitting device of claim 35, further comprising light conversion material within the cavity.

37. The light emitting device of claim 35, wherein the light emitting element comprises a gallium nitride based light emitting element.

38. The light emitting device of claim 35, wherein the at least one cavity comprises a trench in the substrate.

39. The light emitting device of claim 35, wherein the at least one cavity comprises a plurality of cavities in the substrate.

40. The light emitting device of claim 35, further comprising a protective structure encapsulating the substrate and the light emitting element.

41. A light emitting device, comprising:

a substrate;

a light emitting element on the substrate;

at least one cavity in the substrate proximate the light emitting element, the cavity being configured to contain a light conversion material; and wherein the substrate comprises a silicon carbide substrate.

42. A light emitting device, comprising:

a substrate;

a light emitting element on the substrate;

at least one cavity in the substrate proximate the light emitting element, the cavity being configured to contain a light conversion material; and wherein the at least one cavity comprises a frusto-conical opening in the substrate.

43. A method of fabricating a light emitting device having a substrate and a light emitting element on the substrate, comprising:

forming at least one cavity in the substrate proximate the light emitting element, the cavity being configured to contain a light conversion material and extending into the substrate to a depth different than a depth of a surface of the substrate on which the light emitting element is provided.

44. The method of claim 43, further comprising depositing light conversion material within the cavity.

45. The method of claim 43, wherein the light emitting element comprises a gallium nitride based light emitting element.

46. The method of claim 43, wherein forming at least one cavity comprises forming a trench in the substrate.

47. The method of claim 43, wherein forming at least one cavity comprises forming a frusto-conical opening in the substrate.

48. The method of claim 43, wherein forming at least one cavity comprises forming a plurality of cavities in the substrate.

49. The method of claim 43, further comprising encapsulating the substrate and the light emitting element in a protective structure.

50. The method of claim 43, further comprising mounting the substrate and the light emitting element in a chip-on-board configuration.

51. A method of fabricating a light emitting device having a substrate and a light emitting element on the substrate, comprising:

forming at least one cavity in the substrate proximate the light emitting element, the cavity being configured to contain a light conversion material, wherein the substrate comprises a silicon carbide substrate.

* * * * *